(12) United States Patent
Newton

(10) Patent No.: US 9,093,966 B1
(45) Date of Patent: Jul. 28, 2015

(54) ESD PROTECTION CIRCUIT FOR CASCODE AMPLIFIERS

(71) Applicant: M/A-COM Technology Solutions Holdings, Inc., Lowell, MA (US)

(72) Inventor: John C. Newton, Stoneham, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 57 days.

(21) Appl. No.: 14/028,984

(22) Filed: Sep. 17, 2013

(51) Int. Cl.
    *H03F 1/52* (2006.01)
    *H02H 9/04* (2006.01)
    *H03F 1/22* (2006.01)
    *H03F 3/45* (2006.01)

(52) U.S. Cl.
    CPC ............... *H03F 1/523* (2013.01); *H03F 1/223* (2013.01); *H03F 3/45179* (2013.01)

(58) Field of Classification Search
    USPC .......... 330/298, 207 P, 311, 252–261
    See application file for complete search history.

(56) References Cited

U.S. PATENT DOCUMENTS

| 6,853,526 B1 | 2/2005 | van Saders et al. ......... 361/91.1 |
| 8,130,481 B2* | 3/2012 | Yang et al. ...................... 361/56 |
| 2014/0167862 A1* | 6/2014 | Khatri et al. .................. 330/298 |

* cited by examiner

*Primary Examiner* — Hieu Nguyen

(74) *Attorney, Agent, or Firm* — Christopher P. Maiorana, PC

(57) ABSTRACT

An apparatus includes a cascode amplifier and an electrostatic discharge (ESD) protection circuit. The cascode amplifier includes a common source device and a common gate device. The electrostatic discharge (ESD) protection circuit includes a device channel coupled between a drain and a gate of the common gate device. The device channel provides a short circuit between the drain and gate of the common gate device when the cascade amplifier is unbiased.

20 Claims, 4 Drawing Sheets

ESD PROTECTION CIRCUIT FOR CASCODE AMPLIFIERS

FIELD OF THE INVENTION

The present invention relates to electrostatic discharge (ESD) protection generally and, more particularly, to a method and/or apparatus for implementing an ESD protection circuit for cascode amplifiers.

BACKGROUND OF THE INVENTION

Based on extensive electrostatic discharge (ESD) testing, common gate field effect transistors (FETs) have been identified as a weak point of a differential cascode amplifier circuit. Common source FETs of the differential cascode amplifier circuit have reverse diode chains that offer effective ESD protection. An output of the differential cascode amplifier circuit is provided by drains of the common gate FETs. In typical applications, the output nodes can operate at 24 VDC. Typical ESD protection, such as diode chains or clamps, are not viable options. Because of the high voltage, many series diodes are needed, which takes up too much area on a chip. Conventional ESD clamps have large parasitics and degrade radio frequency (RF) performance.

It would be desirable to implement an ESD protection circuit for cascode amplifiers that avoids the above problems.

SUMMARY OF THE INVENTION

The present invention concerns an apparatus including a cascode amplifier and an electrostatic discharge (ESD) protection circuit. The cascode amplifier includes a common source device and a common gate device. The electrostatic discharge (ESD) protection circuit includes a device channel coupled between a drain and a gate of the common gate device. The device channel provides a short circuit between the drain and gate of the common gate device when the cascode amplifier is unbiased.

The objects, features and advantages of the present invention include providing an ESD protection circuit for cascode amplifiers that may (i) be utilized with both single ended and balanced cascode topologies, (ii) use a modest amount of chip area, and/or (iii) protect drain-gate and/or source-gate junctions of common gate FETs of cascode amplifiers.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
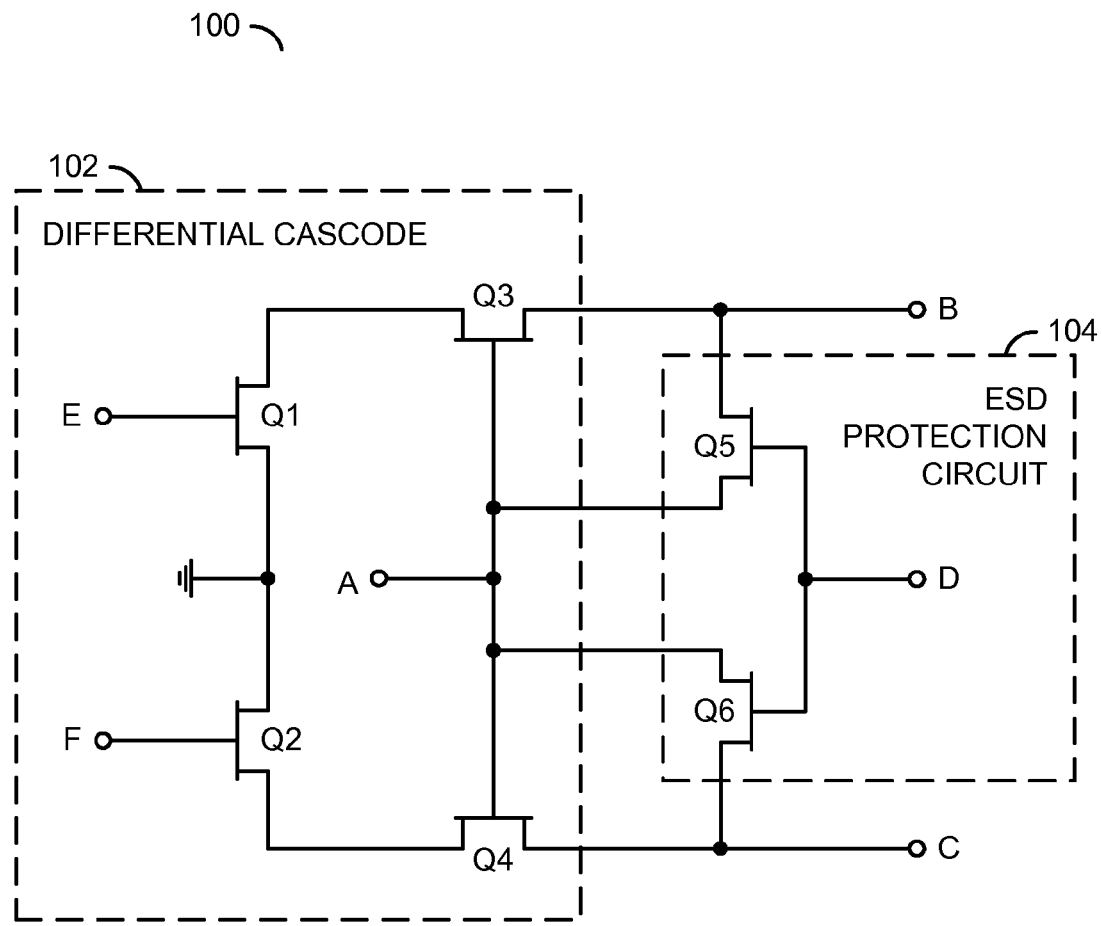
FIG. 1 is a diagram illustrating a differential cascode amplifier with an ESD protection circuit in accordance with an embodiment of the present invention.

Referring to FIG. 1, a block diagram of a circuit 100 is shown illustrating a simplified example of a differential cascode amplifier with electrostatic discharge (ESD) protection in accordance with an embodiment of the present invention. In various embodiments, the circuit 100 comprises a block (or circuit) 102 and a block (or circuit) 104. The block 102 generally implements a differential amplifier having a balanced cascode topology. The block 104 generally implements an ESD protection circuit in accordance with an embodiment of the present invention.

The block 102 may comprise a number of transistors Q1, Q2, Q3, and Q4. The transistors Q1, Q2, Q3, and Q4 may be implemented as field effect transistors (FETs). In various embodiments, the transistors Q1, Q2, Q3, and Q4 may comprise depletion mode FETs. In various embodiments, the transistors Q1 and Q2 are configured as common source FETs of the differential cascode amplifier 102. The transistors Q3 and Q4 are configured as common gate FETs of the differential cascode amplifier 102. Gate terminals of the transistors Q3 and Q4 are connected together to form a node (e.g., A). The node A may be connected to a voltage reference or a bias network (not shown). In some embodiments, the transistors Q3 and Q4 may have series gate resistors.

A first input node (e.g., E) of the differential cascode amplifier 102 may be connected to a gate of the transistor Q1. A second input node (e.g., F) of the differential cascode amplifier 102 may be connected to a gate of the transistor Q2. A source of the transistor Q1 and a source of the transistor Q2 are connected to a voltage supply ground potential. A drain of the transistor Q1 is connected to a source of the transistor Q3. A drain of the transistor Q2 is connected to a source of the transistor Q4. A drain of the transistor Q3 may be connected to a first output node (e.g., B) of the differential cascode amplifier 102. A drain of the transistor Q4 may be connected to a second output node (e.g., C) of the differential cascode amplifier 102.

The block 104 may comprise a number of transistors Q5 and Q6. In various embodiments, the transistors Q5 and Q6 may be implemented as field effect transistors (FETs). The transistors Q5 and Q6 have a channel that is normally ON (low impedance) when no bias is applied to terminals (drain, gate, and source) of the transistors Q5 and Q6. For example, the transistors Q5 and Q6 may comprise depletion mode FETs. The channel of the transistors Q5 and Q6 is OFF (high impedance) when a control terminal (gate) is biased at a lower (e.g., lower than threshold voltage) potential than the channel terminals (drain and source). In some embodiments, the transistors Q5 and Q6 may be implemented using multi-gate FETs to further reduce parasitics.

In various embodiments, a gate of the transistor Q5 is connected to a gate of the transistor Q6, forming a node (e.g., D). In some embodiments, the transistors Q5 and Q6 may have series gate resistors. The node D may be held at a bias potential via an internal or external reference voltage. The reference voltage may be generated using a resistive voltage divider, other bias circuitry, or a voltage source (not shown). The reference voltage is provided only when the amplifier is operating in a normally biased mode (or similar powered ON mode), an example of which is illustrated in FIG. 2.

In various embodiments, the block 104 is connected in such a way as to protect a drain gate junction and/or a source gate junction of the common gate transistors (e.g., transistors Q3 and Q4) of the block 102 from electrostatic discharge (ESD) damage. Protection of the transistor Q3 from ESD energy between the nodes A and B is generally provided by the transistor Q5. A drain of the transistor Q5 is connected to the output node B of the differential cascode amplifier 102, which is also connected to the drain of the transistor Q3. A source of the transistor Q5 is connected to the node A, which is also connected (often through a series resistor) to the gate of the transistor Q3. Protection of the transistor Q4 from ESD energy between the nodes A and C is generally provided by the transistor Q6. A drain of the transistor Q6 is connected to the output node C of the differential cascode amplifier 102, which is also connected to the drain of the transistor Q4. A source of the transistor Q6 is connected to the node A, which is also connected (often through a series resister) to the gate of the transistor Q4.

Figure 2:
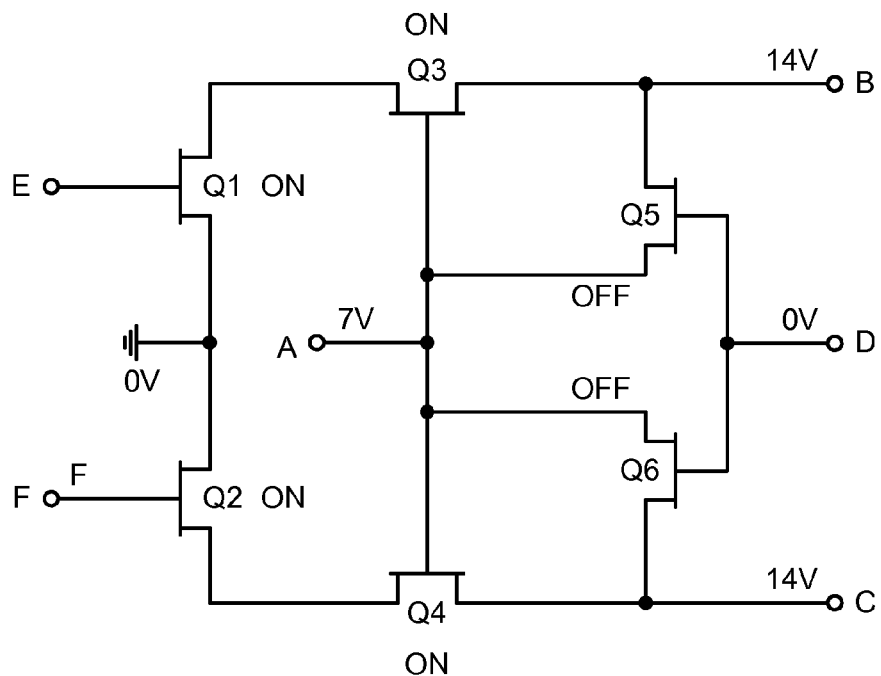
FIG. 2 is a diagram illustrating a first operating mode of the cascode amplifier and ESD protection circuit of FIG. 1.

Referring to FIG. 2, a diagram is shown illustrating a first operating mode of the cascode amplifier and ESD protection circuit of FIG. 1. During operation of the circuit 100 in a first (e.g., normally biased) mode, the node D is held at a lower voltage than the nodes A, B, and C to ensure that transistors Q5 and Q6 are in an OFF state (e.g., deeply pinched off). In the OFF state the transistors Q5 and Q6 present a high impedance to the circuit 102. The node D may be held at the lower potential via an internal or external reference voltage. The reference voltage may be generated using a resistive voltage divider, other bias circuitry, or a voltage source (not shown). The reference voltage is provided only when the amplifier is in the normally biased operating mode (or similar powered ON mode). In some embodiments, the transistors Q5 and Q6 have an offset gate (e.g., a gate that is closer to the source than to the drain). The offset gate reduces parasitic capacitance from the drain to the gate (e.g., Cgd), and minimizes degradation of performance of the output node B by the transistor Q5 and the output node C by the transistor Q6.

Figure 3:
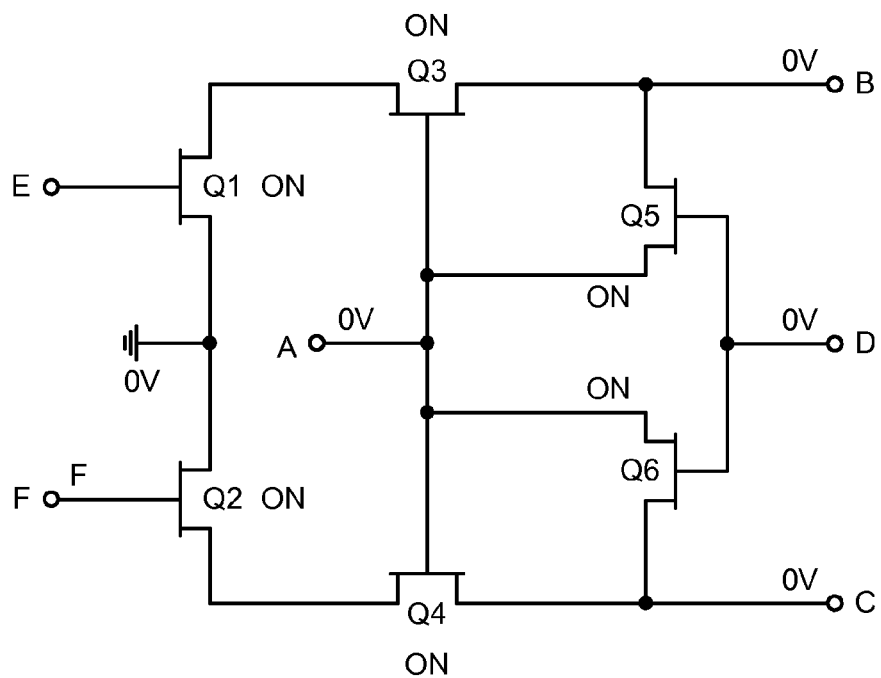
FIG. 3 is a diagram illustrating a second operating mode of the cascode amplifier and ESD protection circuit of FIG. 1.

Referring to FIG. 3, a diagram is shown illustrating a second operating mode of the cascode amplifier and ESD protection circuit of FIG. 1. When the circuit 100 is in a second (e.g., un-biased or un-powered) mode (e.g., such as during handling, assembly, etc.), the voltages on the nodes A, B, and D are generally equivalent (e.g., substantially equal) and the transistors Q5 and Q6 are in an ON state. Under this condition, the transistor Q5 presents a low impedance path between the nodes A and B, and the transistor Q6 presents a low impedance path between the nodes A and C. Any ESD energy will take the low impedance path through the transistors Q5 and Q6 instead of through the drain gate junction and/or source gate junction of the transistors Q3 and Q4, respectively, thus protecting the transistors Q3 and Q4 from ESD damage.

Protection of transistors Q3 and Q4 from ESD energy between the nodes B and C is provided also by the transistors Q5 and Q6 as follows. During operation of the circuit 100 in the normally biased mode, the node D is held at a lower voltage than the node A, the node B, and the node C. Under this condition, the transistors Q5 and Q6 are in the OFF state and present a high impedance between the output nodes B and C of the circuit 100. When the circuit 100 is un-biased or un-powered, the voltages on the nodes A, B, C and D are substantially equal and the transistors Q5 and Q6 are in the ON state. Under this condition, the transistors Q5 and Q6 provide a low impedance path between the output nodes B and C. ESD energy will take the low impedance path through the transistors Q5 and Q6, instead of going through the transistors Q1, Q2, Q3 and Q4, thus protecting the transistors Q1, Q2, Q3 and Q4 from ESD damage.

Figure 4:
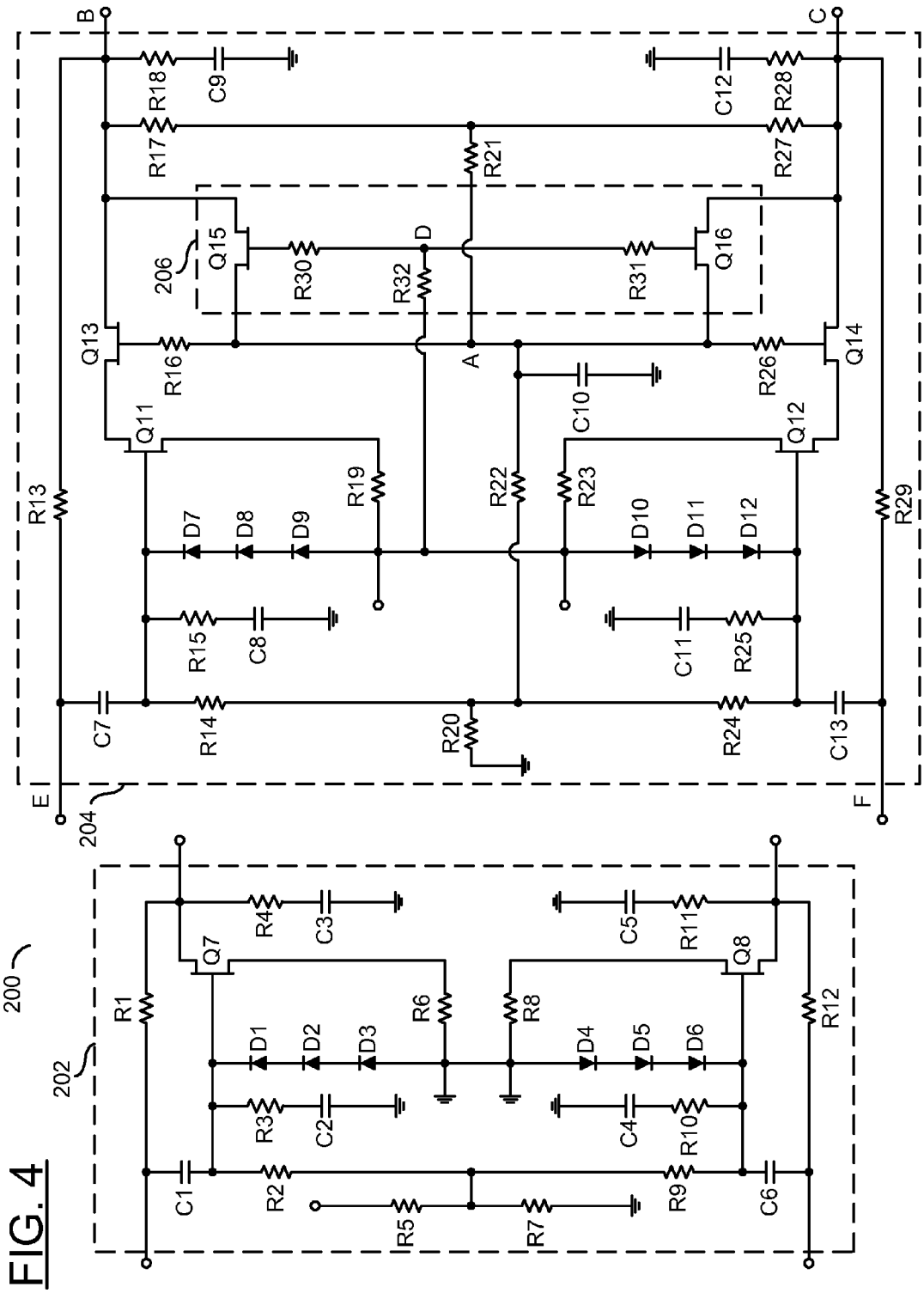
FIG. 4 is a schematic diagram illustrating an example implementation of a two-stage differential cascode amplifier and ESD protection circuit in accordance with an embodiment of the present invention.

Referring to FIG. 4, a schematic diagram of a circuit 200 is shown illustrating an example implementation of a two-stage differential cascode amplifier and ESD protection circuit in accordance with an embodiment of the present invention. The circuit 200 comprises a block (or circuit) 202, a block (or circuit) 204, and a block (or circuit) 206. The block 202 generally implements a first (or input) stage of the two-stage differential cascode amplifier. The block 204 generally implements a second (or output) stage of the two-stage differential cascode amplifier. The block 206 generally implements an ESD protection circuit in accordance with an embodiment of the present invention. The ESD protection circuit 206 is connected to the output stage (stage two) 204 of the two-stage differential cascode amplifier.

In various embodiments, the block 202 may implement a common source topology amplifier stage comprising a FET Q7, a FET Q8, a number of resistors R1-R12, a number of capacitors C1-C6, and a number of diodes D1-D6. The block 204 may implement a balanced cascode topology amplifier stage similar to the cascode topology of the circuit 100. For example, the block 204 may comprise a FET Q11, a FET Q12, a FET Q13, a FET Q14, a number of resistors R13-R29, a number of capacitors C7-C13, and a number of diodes D7-D12. The FET Q11 and the FET Q12 may be configured as the common source transistors (e.g., similar to the FETs Q1 and Q2 in FIG. 1). The FET Q13 and the FET Q14 may be configured as the common gate transistors (e.g., similar to the FETs Q3 and Q4 in FIG. 1).

The block 206 generally comprises a pair of FETs Q15 and Q16. The FETs Q15 and Q16 may be configured similarly to the FETs Q5 and Q6 of FIG. 1. For example, the FETs Q15 and Q16 are connected to the common gate transistors, Q13 and Q14, respectively, of the block 204. In this example, the gates of the transistors Q15 and Q16 are connected together (e.g., through gate resistors R30 and R31) as the node D of the ESD protection circuit, and the node D is connected (e.g., via a resistor R32) to a ground reference of the second stage block 204. The ground reference of the second stage block 204 may or may not be the same as the ground reference of the first stage block 202.

The gates of the transistors Q13 and Q14 are connected together (e.g., through gate resistors R16 and R26) forming the node A, which is biased internally using a resistive divider circuit (e.g., R17, R20, R21, R22, R27, R29). The FETs Q7, Q8, Q11, and Q12 are protected from ESD strikes using traditional diode chains (e.g., D1-D3, D4-D6, D7-D9, D10-12, respectively) between the respective gates and sources. Since the voltage difference between the gate and source nodes is typical less than 1 volt, few diodes are needed. The voltage difference between the drain and gate nodes of the transistors Q13 and Q14 could be as high as 10 volts or more, protection of which would take a large number of diodes and would take up a significantly larger die area.

Figure 5:
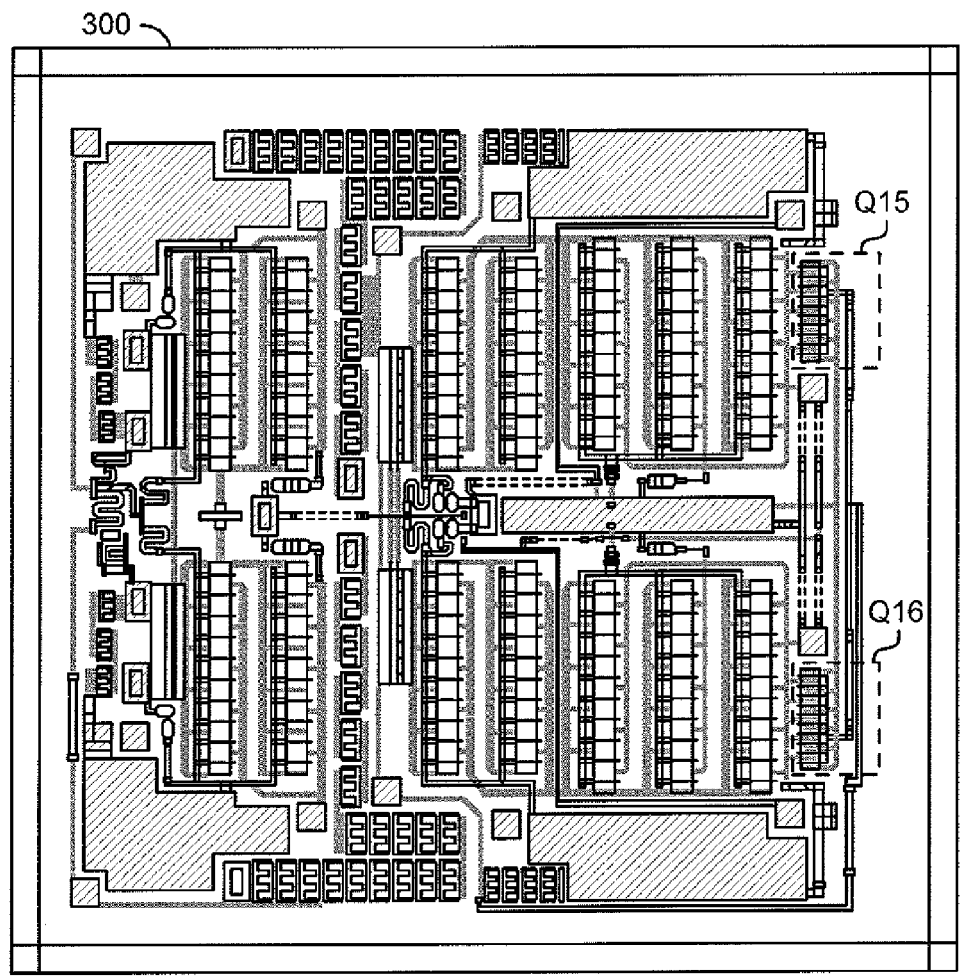
FIG. 5 is a diagram illustrating an example die layout for the two-stage differential cascode amplifier and ESD protection circuit of FIG. 4.

Referring to FIG. 5, a diagram is shown illustrating a representation of an example die layout 300 for the two-stage differential cascode amplifier and ESD protection circuit of FIG. 4. The two-stage differential cascode amplifier and ESD protection circuit in accordance with an embodiment of the present invention may be fabricated as a monolithic microwave integrated circuit (MMIC) having a die layout similar to the layout 300. The two-stage differential cascode amplifier circuit with the ESD protection circuit in accordance with embodiments of the present invention generally demonstrates a higher ESD rating for the output nodes B and C when compared to a similar circuit without the ESD protection circuit. In some embodiments, the die layout 300 may use a 500 μm FET for the transistors Q15 and Q16, while the amplifier FETs Q11, Q12 and Q13, Q14 may be implemented with 1100 μm and 1650 μm FETs, respectively. Protection from an ESD level greater than 700V on nodes B and C may be realized using the die layout 300, as compared to 350V without the ESD protection circuit in accordance with embodiments of the present invention. A higher ESD level could be achieved with further optimization of the FET periphery and layout geometry. As illustrated in FIG. 5, the ESD protection circuit takes up minimal die area.

Figure 6:
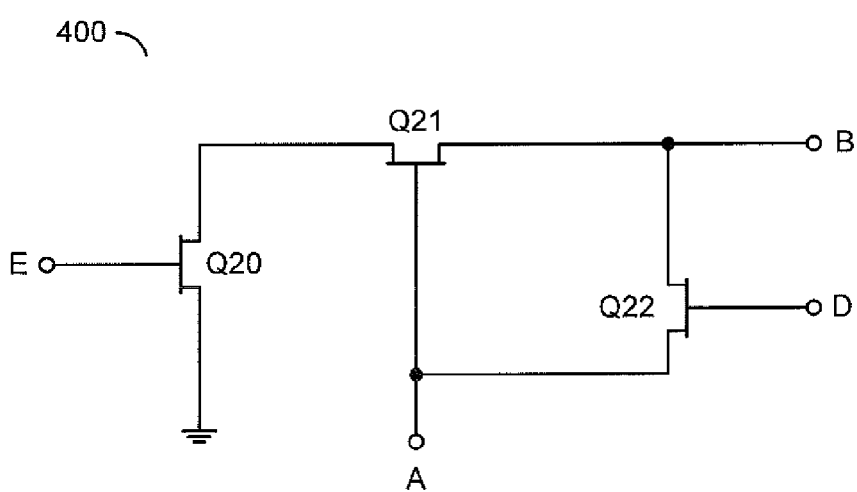
FIG. 6 is a diagram illustrating a single ended cascode amplifier with an ESD protection circuit in accordance with an embodiment of the present invention.

Referring to FIG. 6, a circuit 400 is shown illustrating a simplified single-ended cascode amplifier and ESD protection circuit in accordance with an embodiment of the invention. The single-ended cascode amplifier may comprise a transistor Q20 and a transistor Q21. The transistors Q20 and Q21 may be implemented as field effect transistors (FETs). In various embodiments, the transistors Q20 and Q21 may comprise depletion mode FETs. However, other types of devices (e.g., enhancement mode FET, JFET, etc.) may be implemented accordingly to meet the design criteria of a particular implementation.

In various embodiments, the transistors Q20 and Q21 are configured as a common source FET and a common gate FET, respectively, of the single-ended cascode amplifier 400. A gate terminal of the transistor Q21 forms a node (e.g., A). The node A may be connected to a voltage reference or a bias network (not shown). In some embodiments, the transistor Q21 may have a series gate resistor. An input node (e.g., E) of the single-ended cascode amplifier 400 may be connected to a gate of the transistor Q20. A source of the transistor Q20 is connected to a voltage supply ground potential. In some embodiments, the source of the transistor Q20 may be connected to the ground potential through a resistor. A drain of the transistor Q20 is connected to a source of the transistor Q21. A drain of the transistor Q21 is connected to an output node (e.g., B) of the single-ended cascode amplifier 400.

In various embodiments, the transistor Q22 may be implemented as a field effect transistor (FET). The transistors Q22 has a channel that is normally ON (low impedance) when no bias is applied to respective terminals (drain, gate, and source) of the transistor Q22. For example, the transistor Q22 may comprise a depletion mode FET. The channel of the transistor Q22 is OFF (high impedance) when a control terminal (gate) is biased at a lower (e.g., lower than threshold voltage) potential than the channel terminals (drain and source). In some embodiments, the transistor Q22 may be implemented using a multi-gate FET to further reduce parasitics.

In various embodiments, a gate of the transistor Q22 forms a node (e.g., D) of the ESD protection circuit. The node D may be held at a bias potential via an internal or external reference voltage. The reference voltage may be generated using a resistive voltage divider, other bias circuitry, or a voltage source (not shown). The reference voltage is provided only when the amplifier 400 is operating in a normally biased mode (or similar powered ON mode). In some embodiments, the transistors Q22 may have a series gate resistor.

In various embodiments, the transistor Q22 is connected in such a way as to protect a drain gate junction and/or a source gate junction of the transistor Q21 from electrostatic discharge (ESD) damage. Protection of the transistor Q21 from ESD energy between the nodes A and B is generally provided by the transistor Q22. A drain of the transistor Q22 is connected to the output node B of the cascode amplifier 400, which is also connected to the drain of the transistor Q21. A source of the transistor Q22 is connected to the node A, which is also connected (often through a series resistor) to the gate of the transistor Q21. The circuit 400 comprising the single-ended cascode amplifier and ESD protection circuit in accordance with an embodiment of the present invention may be fabricated as a monolithic microwave integrated circuit (MMIC).

While the invention has been particularly shown and described with reference to the preferred embodiments thereof, it will be understood by those skilled in the art that various changes in form and details may be made without departing from the scope of the invention.

The invention claimed is:

1. An apparatus comprising:
  a cascode amplifier comprising a common source device and a common gate device; and
  an electrostatic discharge (ESD) protection circuit comprising a channel of a field effect transistor coupled between a drain and a gate of said common gate device, wherein said channel provides a short circuit between said drain and said gate of said common gate device when respective terminals of said field effect transistor are unbiased.

2. The apparatus according to claim 1, wherein said channel presents a high impedance between said drain and said gate of said common gate device when a gate of said field effect transistor is biased.

3. The apparatus according to claim 1, wherein said field effect transistor of said ESD protection circuit comprises a depletion mode field effect transistor.

4. The apparatus according to claim 3, wherein a gate of said depletion mode field effect transistor of said ESD protection circuit is tied to a potential that results in said channel being pinched OFF when said cascode amplifier is powered ON.

5. The apparatus according to claim 4, wherein said gate of said depletion mode field effect transistor is tied to a ground potential.

6. The apparatus according to claim 1, wherein said cascode amplifier and said ESD protection circuit are fabricated on a monolithic microwave integrated circuit.

7. An apparatus comprising:
  a differential cascode amplifier comprising a first common source device, a second common source device, a first common gate device, and a second common gate device; and
  an electrostatic discharge (ESD) protection circuit comprising a first field effect transistor and a second field effect transistor, wherein a first channel of said first field effect transistor is coupled between a drain and a gate of said first common gate device, a second channel of said second field effect transistor is coupled between a drain and a gate of said second common gate device, and said first and said second channels provide short circuit paths between said drains and said gates of said first and said second common gate devices when respective terminals of said first and said second field effect transistors are unbiased.

8. The apparatus according to claim 7, wherein said first channel and said second channel present a high impedance between said drains and said gates of said first and said second common gate devices, respectively, when gates of said first and said second field effect transistors are biased.

9. The apparatus according to claim 7, wherein said ESD protection circuit also provides a short between differential outputs of said differential cascode amplifier when said cascade amplifier is unbiased.

10. The apparatus according to claim 7, wherein said first and said second field effect transistors of said ESD protection circuit comprise a pair of depletion mode field effect transistors connected in series between said drain of said first common gate device and said drain of said second common gate device.

11. The apparatus according to claim 10, wherein gates of said pair of depletion mode field effect transistors of said ESD protection circuit are connected together.

12. The apparatus according to claim 11, wherein said gates of said first and said second common gate devices are connected together with a node formed by the serial connection of said pair of depletion mode field effect transistors.

13. The apparatus according to claim 7, wherein said differential cascode amplifier and said ESD protection circuit are fabricated on a monolithic microwave integrated circuit.

14. A method of providing electrostatic discharge (ESD) protection in a cascade topology amplifier comprising:
 coupling a channel of a field effect transistor between a gate terminal and a drain terminal of a common gate device of said cascode topology amplifier; and
 biasing a gate of said field effect transistor such that said channel provides a short circuit between said drain and said gate terminals of said common gate device when said cascade topology amplifier is unbiased and presents an open circuit between said drain and said gate terminals of said common gate device when said cascode topology amplifier is biased.

15. The method according to claim 14, wherein said field effect transistor comprises a depletion-mode field effect transistor.

16. The method according to claim 14, wherein said field effect transistor comprises a multi-gate field effect transistor.

17. The method according to claim 14, wherein said cascode topology amplifier comprises at least one of a depletion-mode field effect transistor, an enhancement-mode field effect transistor, and a junction field effect transistor.

18. The apparatus according to claim 1, wherein said field effect transistor comprises a multi-gate field effect transistor.

19. The apparatus according to claim 1, wherein said cascode topology amplifier comprises at least one of a depletion-mode field effect transistor, an enhancement-mode field effect transistor, and a junction field effect transistor.

20. The apparatus according to claim 7, wherein said cascode topology amplifier comprises at least one of a depletion-mode field effect transistor, an enhancement-mode field effect transistor, and a junction field effect transistor.

* * * * *